(12) United States Patent
Shirahama et al.

(10) Patent No.: US 7,518,903 B2
(45) Date of Patent: Apr. 14, 2009

(54) SEMICONDUCTOR MEMORY DEVICE AND SEMICONDUCTOR INTEGRATED CIRCUIT SYSTEM

(75) Inventors: Masanori Shirahama, Shiga (JP); Yasuhiro Agata, Osaka (JP); Yasue Yamamoto, Osaka (JP); Hirohito Kikukawa, Osaka (JP)

(73) Assignee: Panasonic Corporation, Osaka (JP)

( * ) Notice: Subject to any disclaimer, the term of this patent is extended or adjusted under 35 U.S.C. 154(b) by 27 days.

(21) Appl. No.: 11/712,480

(22) Filed: Mar. 1, 2007

(65) Prior Publication Data

US 2007/0206403 A1 Sep. 6, 2007

(30) Foreign Application Priority Data

Mar. 1, 2006 (JP) .............................. 2006-055110

(51) Int. Cl.
*G11C 11/00* (2006.01)
(52) U.S. Cl. .................... 365/148; 365/189.09; 365/203
(58) Field of Classification Search ................. 365/148, 365/189.09, 203, 189.01, 205, 207
See application file for complete search history.

(56) References Cited

U.S. PATENT DOCUMENTS

| 7,092,277 B2 * | 8/2006 | Bedeschi et al. ............ 365/148 |
| 2004/0027907 A1 | 2/2004 | Ooishi |
| 2005/0231999 A1 | 10/2005 | Moriyama |

FOREIGN PATENT DOCUMENTS

JP 2004-158119 6/2004

\* cited by examiner

*Primary Examiner*—David Lam
(74) *Attorney, Agent, or Firm*—McDermott Will & Emery LLP

(57) ABSTRACT

In a semiconductor memory device including resistance change memory devices, when a resistance change memory device is in standby mode, the two terminals of the resistance change memory device, i.e., a bit line and a source line, are set at a precharge potential Vp, respectively. At the time of a set operation, the bit line is set to a set voltage Vd, which is higher than the precharge potential Vp, while the source line is grounded. At the time of a reset operation, bit line is grounded, while the source line is set to the set voltage Vd. At the time of a data-read operation, the source line is grounded by a read bias generation circuit, while the potential of the bit line is kept at the precharge potential Vp.

12 Claims, 13 Drawing Sheets

601' REFERENCE POTENTIAL GENERATION CIRCUIT

000# SEMICONDUCTOR MEMORY DEVICE AND SEMICONDUCTOR INTEGRATED CIRCUIT SYSTEM

CROSS-REFERENCE TO RELATED APPLICATION

This Non-provisional application claims priority under 35 U.S.C. §119(a) on Patent Application No. 2006-055110 filed in Japan on Mar. 1, 2006, the entire contents of which are hereby incorporated by reference.

BACKGROUND OF THE INVENTION

The present invention relates to semiconductor memory devices, and more particularly relates to technology that is effectively applicable to a nonvolatile semiconductor memory device, in which resistance change devices are used, and the like.

In recent years, in semiconductor integrated circuit technology, microscaling of fabrication processes has progressed, such that gate oxide films have become thinner and gate electrode materials and the like have been improved. Flash memories, EEPROMs, and other rewritable devices have also achieved technical progress, such as larger scale and higher levels of integration. In the field of systems using semiconductor devices, the intended uses of the devices required therein have been changing; in some cases, devices for security purposes, nonvolatile memory devices, such as IC tags, and OTP devices are included, and there has been an increasing tendency to include rewritable large-capacity nonvolatile memories. Recently, new nonvolatile memories achieving further reduction in area have come along as typical FG nonvolatile memories, such as flash memories and EEPROMs, and have been attracting attention. Representative examples of those memories include FeRAMs using ferroelectric substance, MRAMs using magnetism, and PRAMs as phase change memories, resistance change memories, and various other types of memories.

Of the new nonvolatile memories described above, the resistance change memory devices include an oxide film made of material having a perovskite structure or material such as binary system transition metal oxide. The resistance value of such a memory device is set to a high resistance value (during a set operation) or is set to a low resistance value (during an erasing or reset operation) to make the memory device perform nonvolatile storage.

Conventional voltage bias conditions during set and reset operations in such a resistance change memory have been to use positive and negative voltages. For example, as a bias voltage applied across both ends of a resistance change memory device, a positive voltage having a given value is used, e.g., at the time of writing, and a negative voltage having a give value, whose absolute number is the same as that of the positive voltage but whose sign is different from that of the positive voltage, is used at the time of erasing. Also, the values of the positive and negative voltages vary widely from about 1V to about 5V. This kind of technology has been described in Japanese Laid-Open Publication No. 2004-158119, for example.

However, the conventional resistance change memory described above has the following problem, because the positive and negative voltages are used as the bias voltages.

FIG. 2 shows states in which bias voltages are applied at the time of data writing (set and rest operations) in a conventional semiconductor memory device.

In FIG. 2, the reference numeral 203 refers to a resistance change memory device; 201 to one terminal of the resistance change memory device 203; 202 to the other terminal of the resistance change memory device 203; 204 to a state in which a set bias voltage is applied at the time of a set operation in the resistance change memory device 203, and 205 to a state in which a reset bias voltage is applied at the time of a reset operation in the resistance change memory device 203.

The following can be seen from FIG. 2. The following description is based on the assumption that, in the resistance change memory device 203, a potential difference between the two terminals 201 and 202 required when a set operation for writing data and a reset operation for the written data are performed is a set value Vd. With the other terminal 202 being always at the ground potential GND, the one terminal 201 is subjected to the application of the positive set value +Vd at the time of the set operation, and subjected to the application of the negative set value −Vd at the time of the reset operation, such that the potential of the terminal 201 makes transition between the positive voltage +Vd and the negative voltage −Vd. In this case, since the amount of voltage transition of the terminal 201 is 2×Vd, the large amplitude difference is necessary and a negative potential generation circuit for generating the negative set value −Vd is also needed. However, in an actual semiconductor device having a twin-well structure or the like, a negative potential should not be generated, and it is thus difficult to employ this technology.

Therefore, as a structure in which no negative potential generation circuits are needed, the voltage of the fixed-potential terminal 202 may be set to the positive voltage +Vd, for example. In that case, nevertheless, two voltages, i.e., a boosted voltage of 2×Vd and the ground voltage GND, will be necessary for the one terminal 201, and the voltage amplitude of the terminal 201 will be still as large as 2×Vd, which is the same as the amplitude required in the above-described case. Furthermore, even if the potential is produced internally, the current-supplying capability of the boosted-potential generation circuit is likely to be low, thereby causing drawbacks, such as limitation on the number of bits at the time of writing.

SUMMARY OF THE INVENTION

It is therefore an object of the present invention to provide a semiconductor memory device including resistance change memory devices, in which, in each memory device, a potential difference between the two terminals thereof required to write data is a set value Vd and the voltage amplitude of each terminal is limited to the set value Vd, while high-speed data-writing to and high-speed data-reading from the memory device can be performed.

In order to achieve the object, the present invention employs a structure in which a high potential, such as a set voltage Vd, and a low potential, such as ground potential, are prepared, and only these two potentials, i.e., the high and low potentials, are used to apply a bias potential having a certain value across both terminals of each resistance change memory device in the forward and reverse directions, while the present invention also enables high-speed data reading.

Specifically, a first inventive semiconductor memory device includes: a resistance change memory device with a first node and a second node, for performing a set operation for data and a reset operation for the data by application of a forward bias voltage and a reverse bias voltage across the first and second nodes; a column selection line connected with the first node of the resistance change memory device; a row selection line connected with the second node of the resistance change memory device; a precharge circuit for precharging the first and second nodes of the resistance change memory device to a reference potential when the resistance change memory device is in standby mode; a bias applying circuit for applying a set high potential to one of the first and second nodes of the resistance change memory device and a set low potential to the other of the first and second nodes when the set operation for writing the data is performed, and applying the set low potential to the one node of the resistance change memory device and the set high potential to the other node when the reset operation for the written data is performed; and a read circuit for applying the reference potential to the first or second node of the resistance change memory device when a read operation for reading the data is preformed.

In one embodiment of the present invention, in the first semiconductor memory device, the read circuit applies, to the second or first node of the resistance change memory device, the set low potential or a potential which is higher than the reference potential by a potential required for the data read operation.

In another embodiment, in the first semiconductor memory device, the reference potential is lower than the set high potential.

The present invention is also directed to a semiconductor integrated circuit system including the semiconductor memory device. The inventive semiconductor integrated circuit system includes: a system low-voltage source for supplying voltage to internal circuits, and a data input/output high-voltage source used for data input/output, wherein the reference potential used in the semiconductor memory device is power supply potential of the system low-voltage source, the set high potential used in the semiconductor memory device is power supply potential of the data input/output high-voltage source, and the set low potential used in the semiconductor memory device is ground potential.

In another embodiment of the present invention, the first semiconductor memory device includes a memory cell array including a number of said resistance change memory devices, wherein the bias applying circuit is divided into a first bias applying circuit for applying a bias voltage to the first node of each resistance change memory device and a second bias applying circuit for applying a bias voltage to the second node of each resistance change memory device, and the first bias applying circuit is disposed at one side of the memory cell array, while the second bias applying circuit is disposed at the other side of the memory cell array.

In still another embodiment, in the first semiconductor memory device, the first and second bias applying circuits are controlled by a common bias-voltage-application control signal.

A second inventive semiconductor memory device includes: a resistance change memory device with a first node and a second node, for performing a set operation for data and a reset operation for the data by application of a forward bias voltage and a reverse bias voltage across the first and second nodes; a column selection line connected with the first node of the resistance change memory device; a row selection line connected with the second node of the resistance change memory device; a sense amplifier for amplifying a potential difference between a set reference potential and a potential produced by the value of resistance of the resistance change memory device; an amplification control circuit for making the sense amplifier constantly perform amplification operation when the data is written; and a write circuit for, at the time of the set operation for writing the data or the reset operation for the written data, starting the data set operation or the data reset operation in the resistance change memory device, and receiving an output signal from the sense amplifier to stop the data set operation or the data reset operation according to the received output signal.

In one embodiment of the present invention, in the second semiconductor memory device, a data-read sense amplifier, which is used when a read operation for reading the data is performed, is also used as the sense amplifier, and the semiconductor memory device further includes a set-operation reference potential generation circuit, a reset-operation reference potential generation circuit, and a data-read-operation reference potential generation circuit, which generate different reference potentials for the set operation for writing the data, the reset operation for the written data, and the data-read operation, each of the generated reference potentials being used as the set reference potential.

In another embodiment, in the second semiconductor memory device, the write circuit stops the data set operation or the data reset operation according to an output signal from the data-read sense amplifier.

In another embodiment, the second semiconductor memory device includes a read-data output circuit for externally outputting an output signal from the data-read sense amplifier, wherein the write circuit receives the output signal from the data-read sense amplifier through the read-data output circuit, and timing at which the data-read sense amplifier and the read-data output circuit are started at the time of the set operation for writing the data and the reset operation for the written data is the same as timing at which the data-read sense amplifier and the read-data output circuit are started at the time of the data read operation.

In another embodiment, in the second semiconductor memory device, the three reference potential generation circuits, i.e., the data-write set-operation reference potential generation circuit, the written-data reset-operation reference potential generation circuit, and the data-read-operation reference potential generation circuit, each have a current path, which is the same as a path of current flowing in the resistance change memory device where the data is written or read at the time of the set operation for writing the data, the reset operation for the written data, and the data read operation, have a plurality of resistance devices for voltage division in the current path, and are selected according to a set command, a reset command, and a read command, respectively.

In another embodiment, the second semiconductor memory device includes a reference potential generation circuit for generating the set reference potential, wherein the reference potential generation circuit includes: a first P-channel transistor whose source is connected with a power source used for data writing; a second P-channel transistor whose source is connected with a power source used for data reading; a plurality of resistance devices for voltage division, all of which are connected with the first and second P-channel transistors; and a selection circuit for selecting either the first or second P-channel transistor.

Therefore, according to the present invention, in a case where the potential required for data writing is a set voltage Vd, an additional write potential does not have to be generated, because when the potential difference between the first and second nodes of the resistance change memory device is fixed at +Vd or −Vd, the voltage amplitude of each node is only the set voltage Vd that is applied to the bit line. Also, when the resistance change memory device is in standby mode, the first and second nodes thereof are precharged to a certain potential. This prevents accidental application of a bias voltage and thus effectively suppresses the occurrence of resistance variation caused by disturbance and the like. Also, where a transition from the standby to a data read operation has been made, the precharge potential in that standby state becomes the data read potential. Therefore, as compared with a case in which a potential different from the precharge potential is set as the data read potential, it is not necessary to apply an extra bias voltage to the first and second nodes. This enables the speed of the read operation to be enhanced, while allowing simpler control.

In particular, according to the present invention, in a case where, at the time of a set operation for writing data, for example, a forward bias voltage is applied across the first and second nodes of the resistance change memory device so as to set the resistance thereof at a high value, if it is difficult, in terms of reliability, to maintain the high-resistance-value state in the resistance change memory device, the data can be read with a forward bias voltage being applied across the two nodes of the resistance change memory device, whereby the reliability is maintained at high level. Furthermore, in a case where it is difficult, in terms of reliability, to maintain data-write reset state, that is, low-resistance-value state in the resistance change memory device, a bias voltage in the same direction as that applied at the time of the data-write reset operation can be applied to the resistance change memory device when the data is read, whereby the high reliability is ensured.

Moreover, according to the present invention, the bias voltage applied across the two nodes of the resistance change memory device at the time of data reading does not have to be increased up to the bias voltage required for data writing, thereby enabling simpler control.

In addition, according to the present invention, since it is possible to write data in the resistance change memory device in the semiconductor memory device by using a data input/output high-voltage source of the semiconductor integrated circuit system, a conventionally required boosted-voltage source for supplying a boosted voltage of 2Vd does not have to be used for data writing. Therefore, the voltage source for data writing with high current supply capability is ensured, while it is possible to use small-area low-potential transistors as transistors that form circuits such as bias applying circuits for performing data-write set operation and data-write reset operation. Furthermore, it is not necessary to separately provide a power terminal for the semiconductor memory device in the semiconductor integrated circuit system.

Also, according to the present invention, at the time of data-write set operation and data-write reset operation, the length of current path does not vary, regardless of where the write-target resistance change memory device is located. Thus, variation in bias voltage is suppressed, and the set and reset operations can be performed excellently.

Furthermore, according to the present invention, since the first and second bias applying circuits located respectively at one side and the other side of the memory cell array are controlled by the same common control signals, bias can be applied to the two nodes of the data-write-target resistance change memory device at the same timing.

In addition, according to the present invention, the sense amplifier is made to constantly perform amplification operation while data is written, and the data write operation is stopped in accordance with variation in the output of the sense amplifier which is based on variation in the resistance value of the data-write-target resistance change memory device. Thus, it is possible to stop the data write operation simultaneously with the completion of the data writing, whereby the time required for the data writing can be shortened. Moreover, in a case, as in the case of a multiple value, where the resistance value of a resistance change memory device after data erase requires precision, it is possible to control the level of the resistance value easily and automatically.

Also, according to the present invention, it is not necessary to separately prepare a sense amplifier for detecting the completion of data writing, which contributes area reduction. In addition, the reference potential for the sense amplifier corresponding to a set command or a reset command can be supplied to a row-wise specific bit of the column-wise selected, activated bits.

Moreover, according to the present invention, since the output signal of the data-read sense amplifier is used to perform stop-control for data write operation, it is not necessary to generate a new signal for the stop control.

Furthermore, according to the present invention, when the already included data-read sense amplifier and read-data output circuit are used for detection of the completion of data writing, the timing at which they are started in the data writing is set to be the same as the timing at which they are started in the data reading, thereby eliminating the need for adding an extra circuit for timing generation.

In addition, according to the present invention, when data is written in or read from the write- or read-target resistance change memory device, it is possible to vary the reference potential for the sense amplifier in accordance with variation in the write or read voltage, whereby variations in the fabrication process of the transistors located in the path of current flowing in the resistance change memory device can be absorbed.

Also, according to the present invention, the reference potential for the sense amplifier is varied relatively to a differential voltage between write voltage and read voltage, such that it is possible to generate the reference potential for the sense amplifier by a simpler structure.

DETAILED DESCRIPTION OF THE INVENTION

Hereinafter, the preferred embodiments of the present invention will be described with reference to the accompanying drawings.

For the sake of simplicity of description, the following definitions are given. In the following description, the term "set" means "an operation in which the resistance value of a resistance change memory device is increased so that a low level is output as the output of the nonvolatile semiconductor memory device", while the term "reset" means "an operation in which the resistance value of the resistance change memory device is decreased so that a high level is output as the output of the semiconductor memory device". The term "set" also means "an operation in which a terminal of the resistance change memory device that is connected to a bit line is put to a high potential", while the term "reset" also means "an operation in which the terminal is put to a low potential".

Furthermore, the potential used for data writing will be described as a set value Vd, while the potential used for data reading will be described as a read potential Vp.

First Embodiment

Hereinafter, a semiconductor memory device according to a first embodiment of the present invention will be described.

In this embodiment, a set operation and a reset operation performed when data is written in a resistance change memory device will be first discussed.

Figure 1:
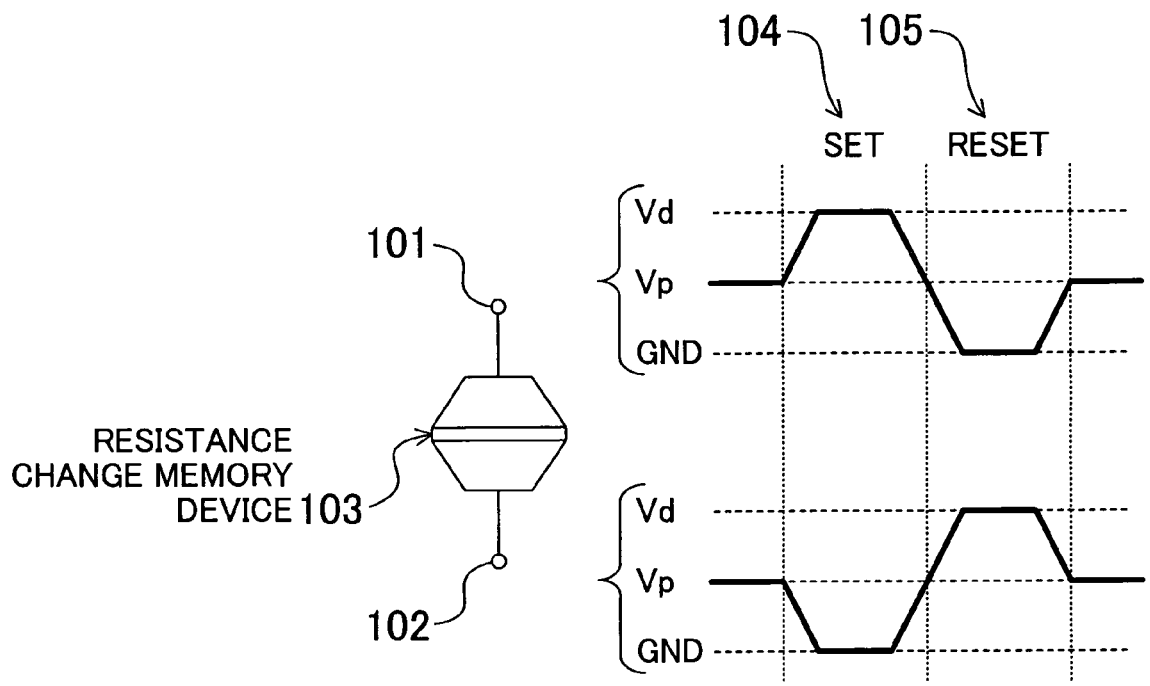
FIG. 1 shows a resistance change memory device included in a semiconductor memory device according to a first embodiment of the present invention, and also shows bias potentials thereto.
Figure 2:
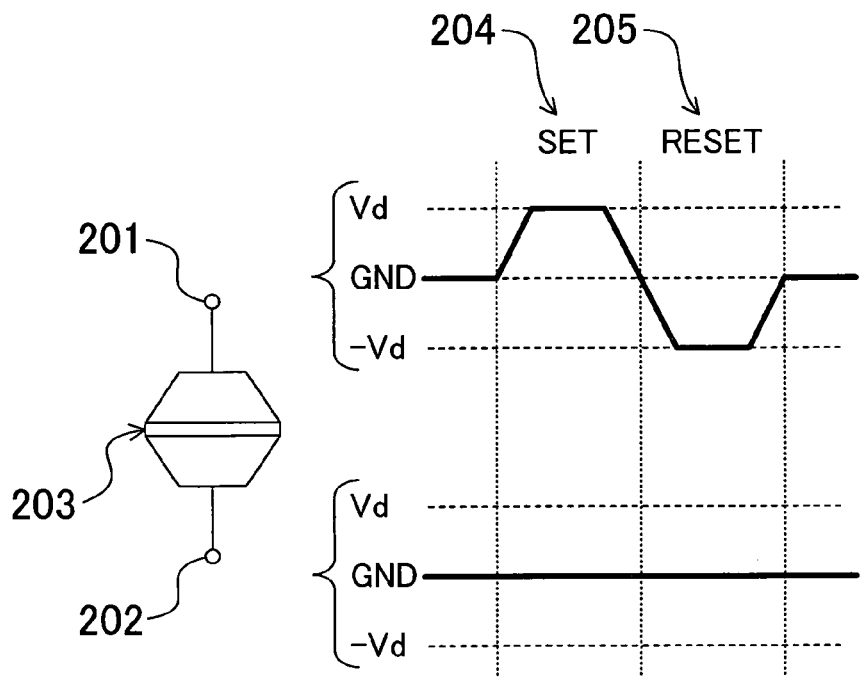
FIG. 2 shows bias potentials to a conventional resistance change memory device.

FIG. 1 shows a resistance change memory device included in the semiconductor memory device according to this embodiment, and also shows states in which bias voltages are applied when the resistance change memory device performs write operation. In FIG. 1, the reference numeral 103 refers to the resistance change memory device; 101 to one terminal (a first node) of the resistance change memory device 103; 102 to the other terminal (a second node) of the resistance change memory device 103; 104 to a voltage application state in which a forward bias voltage is applied at the time of a data-write set operation in the memory device 103; and 105 to a voltage application state in which a reverse bias voltage is applied at the time of a data-write reset operation in the memory device 103.

Assume that, as shown in FIG. 1, in each resistance change memory device 103, a potential difference between the two terminals 101 and 102 required to write the data therein is a set value +Vd. In the resistance change memory device 103 at standby, the two terminals 101 and 102 are precharged to a reference potential Vp, which is lower than the set value Vd (in this embodiment, "standby" includes the state in which, in the memory cell array including numerous resistance change memory devices, all of the resistance change memory devices are unselected, and the non-selected period in which the resistance change memory device in question is unselected but some other memory devices are selected). At the time of the set operation, the terminal 101 is put to the set value Vd and the other terminal 102 is put to a GND potential, whereby the forward bias voltage, i.e., the set voltage Vd, is applied across the two terminals of the memory device 103 with the GND potential of the other terminal 102 being the reference. On the other hand, at the time of the reset operation, which is opposite to the set operation, the terminal 101 is put to the GND potential and the other terminal 102 is put to the set value Vd, whereby the reverse bias voltage, i.e., the negative voltage −Vd, is applied across the two terminals of the memory device 103 with the set voltage Vd of the terminal 102 being the reference.

Figure 4:
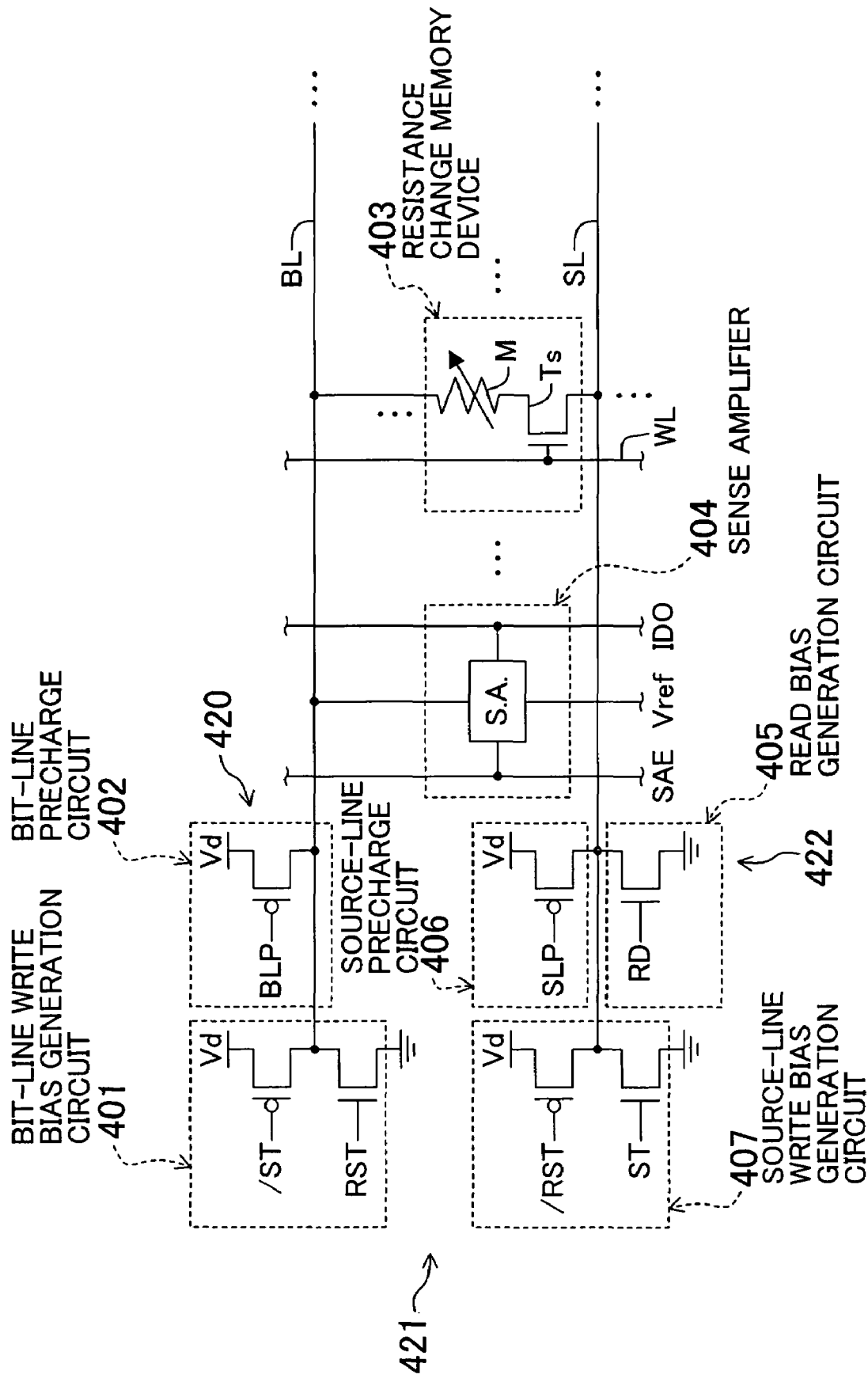
FIG. 4 shows the structure of a sense amplifier and members around the sense amplifier in a semiconductor integrated circuit according to the first embodiment of the present invention.

FIG. 4 illustrates the structure of the main part of a semiconductor integrated circuit according to this embodiment. In FIG. 4, a resistance change memory device 403, a memory cell, is composed of a memory device body M and a selection transistor Ts that are connected together. In the memory device body M, the value of resistance varies according to whether a forward bias voltage or a reverse bias voltage is applied. The selection transistor Ts is an Nch transistor in which the gate potential is the potential of a word line (a row selection line) WL. The resistance change memory device 403 is connected with a bit line (a column selection line) BL, while the source of the selection transistor Ts is connected with a source line SL. In FIG. 4, only the one resistance change memory device 403 is shown, but numerous other resistance change memory devices 403 are arranged in the form of a matrix in the word line WL direction and in the bit line BL direction.

In FIG. 4, the reference numeral 401 refers to a bit-line write bias generation circuit; 402 to a bit-line precharge circuit; 407 to a source-line write bias generation circuit; 406 to a source-line precharge circuit; and 405 to a read bias generation circuit. The reference numeral 404 denotes a sense amplifier, which amplifies a potential difference between a set reference potential Vref and the output potential of the resistance change memory device 403 by a sense amplifier enable signal SAE and outputs an output signal IDO. The bit-line precharge circuit 402 and the source-line precharge circuit 406 form a precharge circuit 420. The bit-line write bias generation circuit 401 and the source-line write bias generation circuit 407 form a bias applying circuit 421. And the bit-line precharge circuit 402 and the read bias generation circuit 405 form a read circuit 422.

Figure 10:
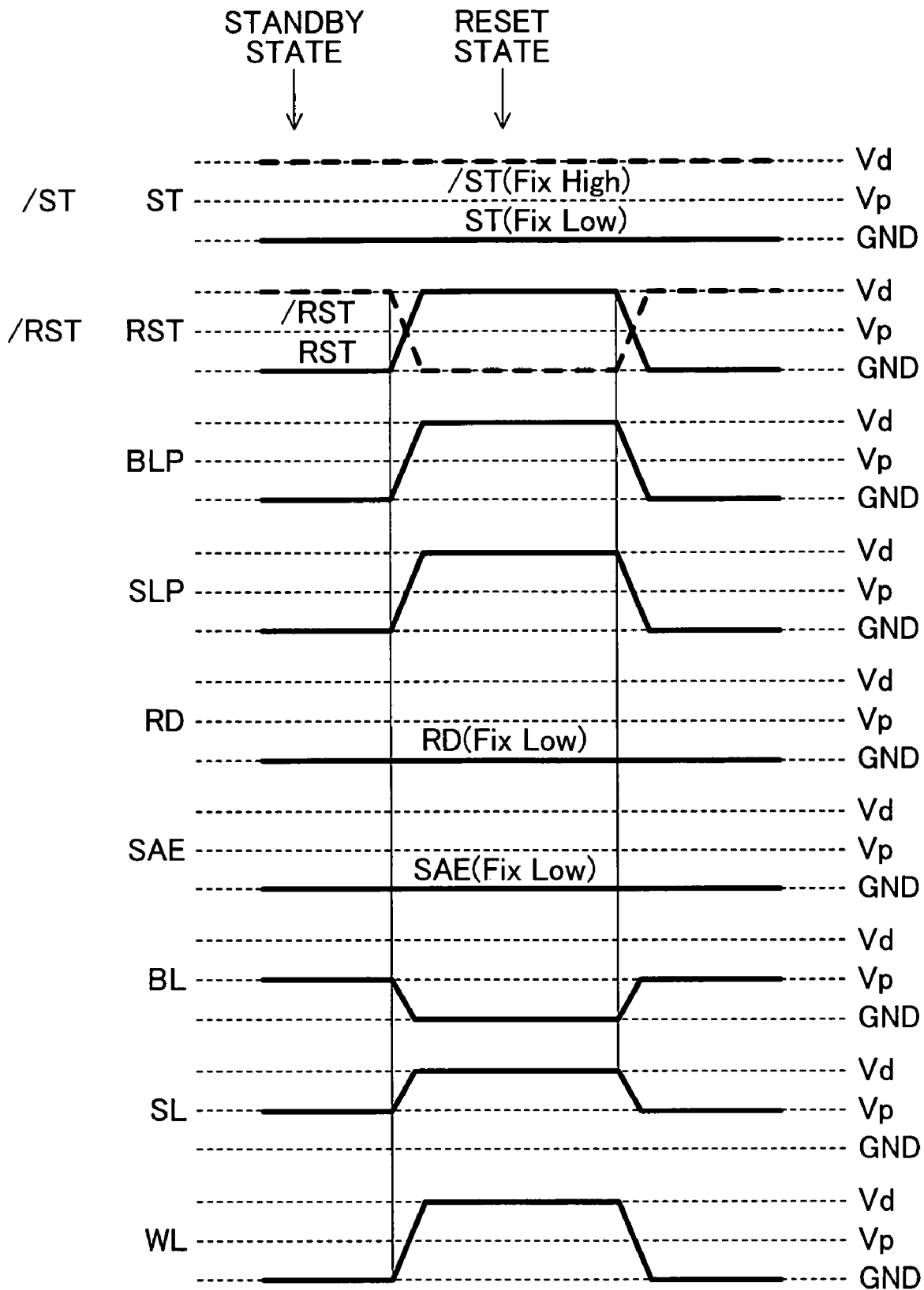
FIG. 10 shows various waveforms occurring when a reset command is issued in the semiconductor integrated circuit according to the first embodiment of the present invention.

FIG. 10 is a waveform diagram when the circuits shown in FIG. 4 perform a reset operation. In FIG. 10, during standby, complementary signals ST and /ST are at the low and high levels, respectively, and the other complementary signals RST and /RST are at the low and high levels, respectively, whereby the bit-line write bias generation circuit 401 and the source-line write bias generation circuit 407 each stop in a cut-off state. On the other hand, two signals BLP and SLP are at the low level, such that the bit-line precharge circuit 402 and the source-line precharge circuit 406, in which internal Pch transistors perform ON operation, precharge the potential of the bit line BL and the potential of the source line SL to the precharge potential Vp.

Thereafter, at the time of the rest operation, the signal RST of the complementary signals RST and /RST shown in FIG. 4 goes to the high level and the inversion signal thereof /RST goes to the low level. The two signals BLP and SLP go to the high level. This causes the two precharge circuits 402 and 406 to come to a stop. And the potential of the word line WL increases to cause the selection transistor Ts to turn on, resulting in the formation of a state in which a bias voltage is applied across the two terminals of the resistance change memory device 403. Since the signal RST is at the high level, the bit-line write bias generation circuit 401 puts the potential of the bit line BL to the low level (GND level). On the other hand, since the signal /RST is at the low level, the source-line write bias generation circuit 407 increases the potential of the source line SL to the set value Vd. Consequently, part of the resistance change memory device 403 close to the bit line BL is at the GND level, while part thereof close to the source line SL is at the set potential Vd, whereby the resistance value of the memory device body M of the resistance change memory device 403 is lowered. Thereafter, even if this bias state, in which the part close to the bit line BL is at the GND level and the part close to the source line SL is at the set potential Vd, is released, the low resistance state is maintained in the memory device body M.

Figure 11:
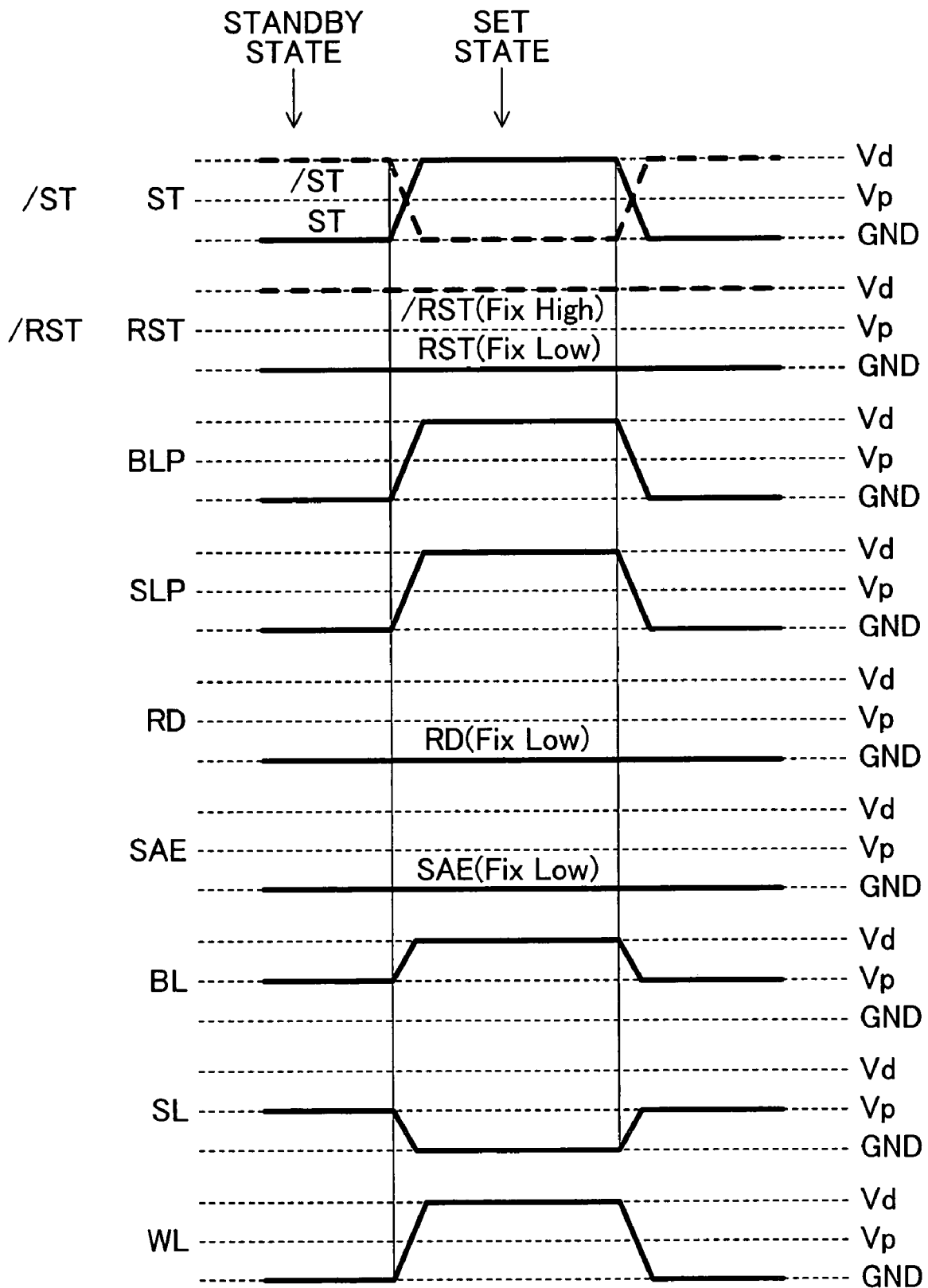
FIG. 11 shows various waveforms occurring when a set command is issued in the semiconductor integrated circuit according to the first embodiment of the present invention.

FIG. 11 is a waveform diagram when the circuits shown in FIG. 4 perform a set operation. In FIG. 11, in contrast to the reset operation shown in FIG. 10, the signal ST of the complementary signals ST and /ST goes to the high level and the inversion signal thereof /ST goes to the low level, while the two signals BLP and SLP both go to the high level. This causes the two precharge circuits 402 and 406 to come to a stop. And the potential of the word line WL increases to produce a state in which a bias voltage is applied across the two terminals of the resistance change memory device 403. Since the signal /ST is at the low level, the bit-line write bias generation circuit 401 raises the potential of the bit line BL to the set value Vd. On the other hand, since the signal ST is at the high level, the source-line write bias generation circuit 407 lowers the potential of the source line SL to the low level (GND level). The set voltage Vd of the bit-line write bias generation circuit 401 is the potential required to write the data into the resistance change memory device 403. Consequently, part of the resistance change memory device 403 close to the bit line BL is at the set potential Vd, while part thereof close to the source line SL is at the GND level, whereby the resistance value of the memory device body M in the resistance change memory device 403 is increased. Thereafter, even if this bias state, in which the part close to the bit line BL is at the set potential Vd and the part close to the source line SL is at the GND level, is released, the high resistance state is maintained in the memory device body M.

Figure 12:
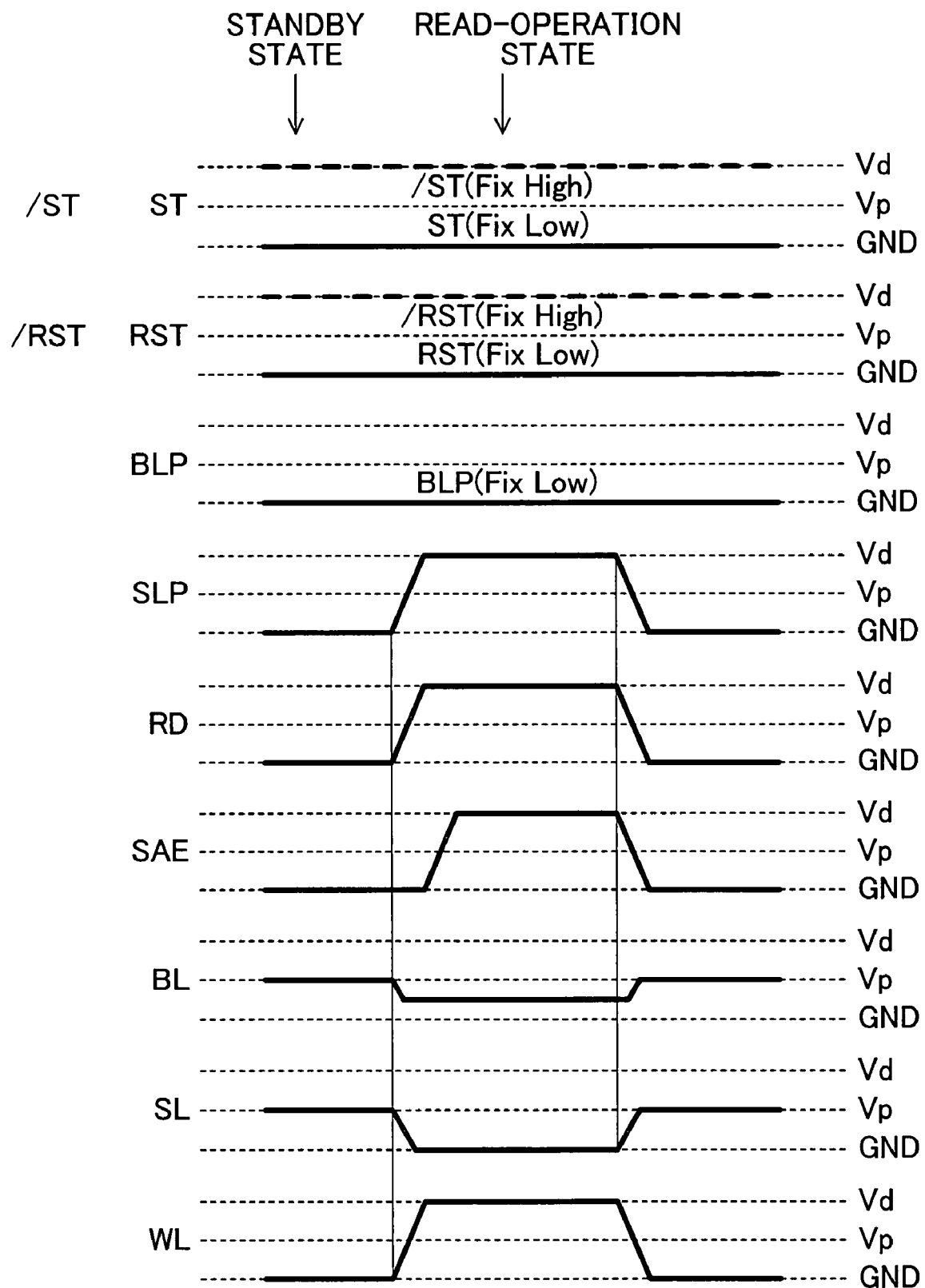
FIG. 12 shows various waveforms occurring when data is read in the semiconductor integrated circuit according to the first embodiment of the present invention.

Next, FIG. 12 is a waveform diagram when the circuits shown in FIG. 4 perform a data read operation. When the read operation shown in FIG. 12 is performed, the complementary signals ST and /ST are set to the low and high levels, respectively, and the other complementary signals RST and /RST are also set to the low and high levels, respectively. The two bias generation circuits 401 and 407 thus come to a stop. The signal BLP is maintained at the low level as in the standby state, and the potential of the bit line BL is set at the precharge potential Vp. In this embodiment, the bit-line precharge circuit 402 is also used, when this read operation is performed. However, if it is desired that the speed of voltage variation in this read operation be different from that in the precharge operation, a read circuit having the same structure as the bit-line precharge circuit 402 may be added.

The signal SLP transitions to the high level, thereby causing the source-line precharge circuit 406 to come to a stop. Furthermore, a read signal RD goes to the high level, and the source line SL lowers to the low level (the GND level). At the same time, the word line WL transitions to the high level. As a result, while part of the resistance change memory device 403 close to the bit line is subjected to the application of the precharge potential Vp as in the standby state, part thereof close to the source line decreases to the GND level. In this embodiment, the precharge potential Vp is set lower than the set voltage Vd. Therefore, as compared with the bias relation at the time of the data-write set operation, that is, the bias relation in which the part of the resistance change memory device 403 close to the bit line is set to the set voltage Vd and the part thereof close to the source line is set to the GND potential, the potential of the part close to the bit line in this read operation is the precharge potential Vp (<Vd) and is thus lower than the set voltage Vd. Therefore, a bias voltage equal to, or higher than, the bias voltage applied at the time of the set operation is not applied across the two terminals of the resistance change memory device 403. This enables the data to be read with the high resistance state in the resistance change memory device 403 being maintained in an excellent manner.

In the case where the potential required for the writing is the set voltage Vd, the voltage applied to each terminal of the resistance change memory device 403 is +Vd or GND in both the set operation and the reset operation, and the voltage variation (amplitude) at each terminal is limited to +Vd and is thus equal to the set voltage Vd applied to the bit line BL. This eliminates the need for a negative potential generation circuit, which has been conventionally required. The elimination of the need for such an extra write-voltage generation circuit permits this embodiment to be also favorably applicable to a semiconductor integrated circuit in which semiconductor devices having a twin-well structure and the like are used.

Moreover, during the standby in the narrow sense, in which all of the included resistance change memory devices 403 are unselected, and during the non-selected period, in which the resistance change memory devices 403 connected to a bit line BL are not selected, the two terminals of each of those unselected resistance change memory devices 403 are precharged to the certain potential Vp (Vp<Vd) that is lower than the set voltage Vd. This prevents accidental application of bias voltage to the terminals of those resistance change memory devices 403 and thus suppresses the occurrence of variation in the resistance value, caused by disturbance and the like, at the terminals of those resistance change memory devices 403.

Furthermore, when reading is started in the narrow-sense standby state or in the non-selected state, the precharge potential Vp in that standby state or in that non-selected state immediately becomes the read potential. Therefore, as compared with a case in which a potential different from the precharge potential is set as the read potential at the time of the reading, it is not necessary to wait until the completion of application of such an unnecessary bias voltage, and simpler control is thus achieved.

In addition, in this embodiment, when the reading is performed, the precharge potential Vp and the GND potential are applied to the bit line BL and the source line SL, respectively. This voltage application state (i.e., the bias voltage application condition for the resistance change memory device 403) is similar to the voltage application state at the time of the set operation, in which the set potential Vd and the GND potential are applied to the bit line BL and the source line SL, respectively. Therefore, even if it is difficult, in terms of reliability, to maintain the high resistance value obtained at the time of the set operation in the resistance change memory device 403 and thus the high resistance value gradually decreases with years of use, it is possible to maintain the high resistance value in an excellent manner by making the relation of voltages applied across the two terminals of the resistance change memory device 403 be the same as that obtained at the time of the set operation. Also, in a case in which the retention capability for retaining the low resistance value of the resistance change memory device 403 in the reset state is low, a structure opposite to that of this embodiment may be employed. Specifically, the source-line precharge circuit 406 may be operated at the time of reading so as to set the potential of the source line SL to the precharge potential Vp, while the read bias generation circuit 405 may be disposed close to the bit line BL and then operated. Alternatively, the potential of the bit line BL may be set to the precharge potential Vp, while a potential, which is higher than the precharge potential Vp by a voltage necessary for data reading, may be applied to the source line SL.

Also, if the semiconductor integrated circuit system including the semiconductor memory device of this embodiment includes semiconductor devices (internal circuits) that operate at low voltage, a system core power source (a system low-voltage source) for supplying the low voltage for operating those semiconductor devices, and a data input/output high-voltage source for supplying high voltage for external data input/output, the semiconductor integrated circuit system may be structured so that the set voltage Vd for the semiconductor memory device of this embodiment is supplied from the data input/output high-voltage source, while the precharge potential Vp is supplied from the system core power source. Then, the current supply capability is increased, while the internal booster circuit for generating the set voltage Vd becomes unnecessary.

Second Embodiment

Figure 5:
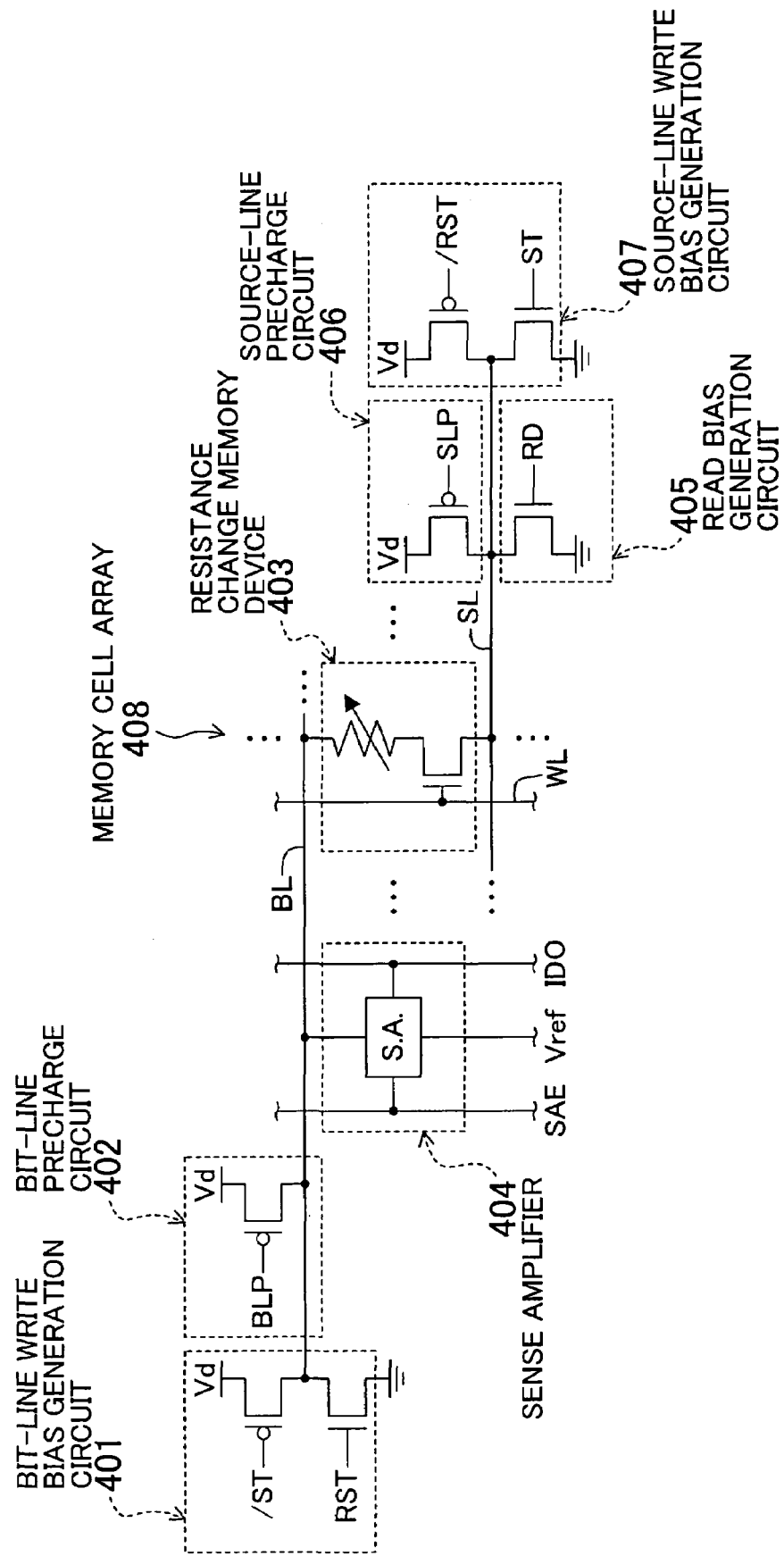
FIG. 5 shows the structure of a sense amplifier and members around the sense amplifier in a semiconductor integrated circuit according to a second embodiment of the present invention.

FIG. 5 illustrates the structure of the main part of a semiconductor memory device according to a second embodiment of the present invention. In FIG. 5, the members common to those shown in FIG. 4 are identified by the same reference numerals.

The semiconductor memory device shown in FIG. 5 differs from the semiconductor memory device shown in FIG. 4 in that a source-line write bias generation circuit (a second bias applying circuit) 407, a source-line precharge circuit 406, and a read bias generation circuit 405 are disposed in different positions. Specifically, in the semiconductor integrated circuit shown in FIG. 4, the source-line write bias generation circuit 407, the source-line precharge circuit 406, and the read bias generation circuit 405 are disposed to the same side (i.e., the side in the light-hand part of FIG. 4) as the bit-line write bias generation circuit (the first bias applying circuit) 401 and the bit-line precharge circuit 402. This embodiment employs a structure in which the source-line write bias generation circuit 407, the source-line precharge circuit 406, and the read bias generation circuit 405 are disposed to the opposite side, that is, to the right (i.e., the other side in FIG. 5) of a memory cell array 408 composed of numerous resistance change memory devices 403 arranged in the row and column directions. The employment of this disposition does not cause any problems, because signal lines ST, /ST, RST, and /RST for control signals are the same control signal lines that go globally and horizontally above the memory cell array 408. Also, when signals are subjected to the application of voltages at the time of a set operation, a reset operation, and a read operation, each signal produces the same waveforms as those described in the first embodiment.

Generally, as in the first embodiment, in the case in which the bit-line write bias generation circuit 401 and the source-line write bias generation circuit 407 are disposed to one side of the memory cell array 408, and the bit-line precharge circuit 402 and the read bias generation circuit 405 are also disposed to the same side, when a current is passed through the series circuit, including the bit line BL, the resistance change memory device 403, and the source line SL, at the time of a set operation, a reset operation, or a read operation, the length of the current path varies depending on the location of the target resistance change memory device 403 for the set operation, the reset operation, or the read operation. Specifically, if the resistance change memory device 403 is located away from the bit-line write bias generation circuit 401 and the like, the current path is long, and if the resistance change memory device 403 is located near the bit-line write bias generation circuit 401 and the like, the current path is short. As a result, the value of bias voltage applied to each resistance change memory device 403 varies depending on the resistance values of the metal wires that form the bit line BL and the source line SL.

However, in this embodiment, voltage decrease due to the resistance of the metal wires of the bit line BL and source line SL is cancelled at the bit line BL side and the source line SL side, regardless of where the target resistance change memory device 403 for a set operation, a reset operation, or a read operation is located. Thus, variations in the value of applied bias voltage in the cell array are adjusted in a self-adjusting manner.

Accordingly, in this embodiment, regardless of the locations of the resistance change memory devices 403 in the memory cell array 408, the bias voltage applied across the terminals of the resistance change memory devices 403 is substantially kept at a certain constant value, whereby it is possible to perform set operation, reset operation, and data read operation uniformly in the resistance change memory devices 403.

Third Embodiment

Next, a third embodiment of the present invention will be described.

Figure 6:
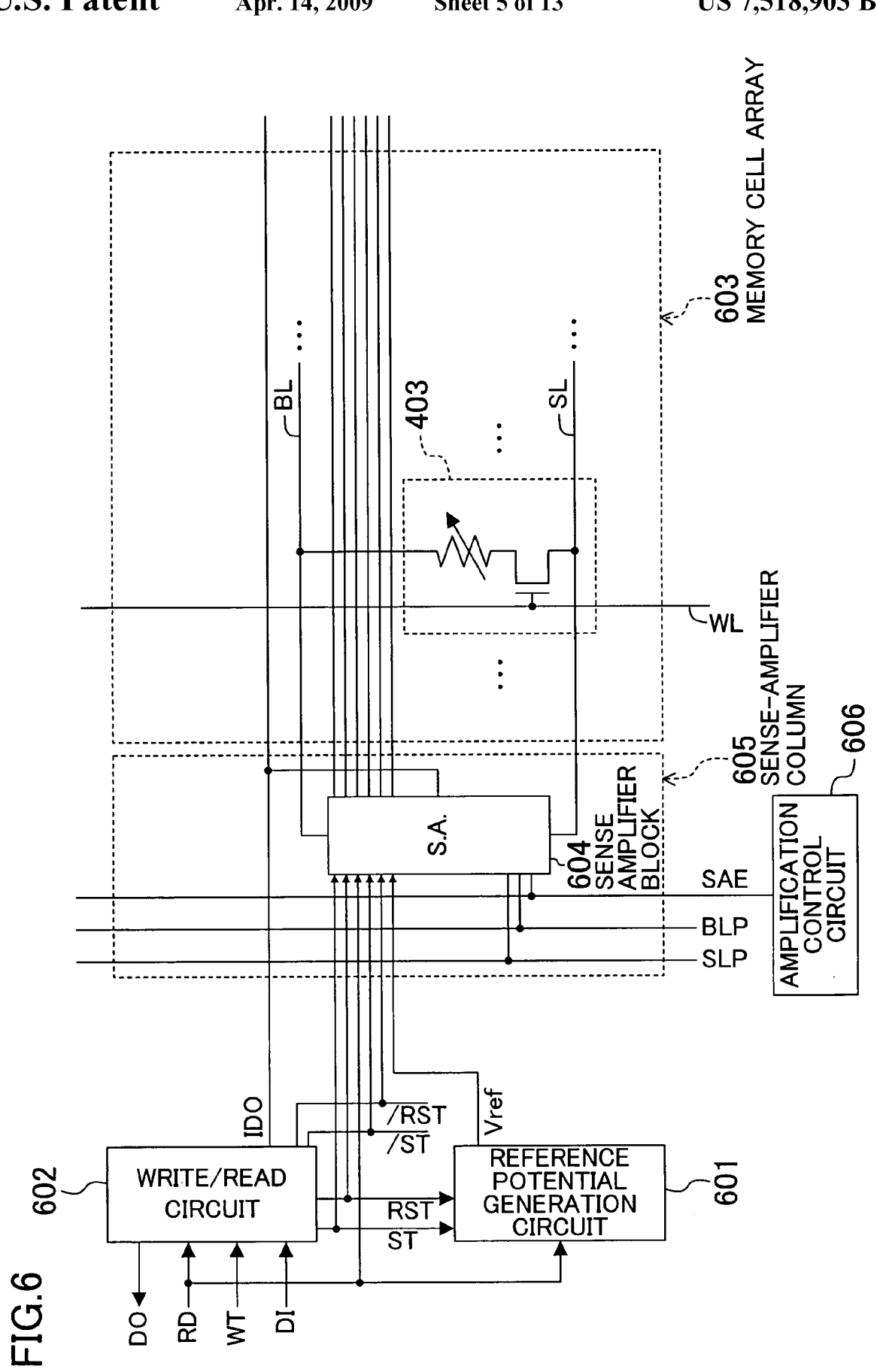
FIG. 6 is a block diagram illustrating the structure of the main part of a semiconductor integrated circuit according to a third embodiment of the present invention.

FIG. 6 illustrates the entire structure of a semiconductor memory device according to the third embodiment of the present invention. In FIG. 6, the members common to those shown in FIG. 4 are identified by the same reference numerals.

In FIG. 6, the reference numeral 602 refers to a write/read circuit having a write buffer therein; 603 to a memory cell array including numerous resistance change memory devices 403 in the row and column directions; and 604 to a sense amplifier block. The sense amplifier block 604 includes the sense amplifier 404, the bit-line and source-line precharge circuits 402 and 406, the bit-line and source-line write bias generation circuits 401 and 407, and the read bias generation circuit 405, shown in FIG. 4. A plurality of such sense amplifier blocks 604 are provided in the word line WL direction to form a sense-amplifier column 605. The circuit operation of the sense amplifier blocks 604 has already been described. The reference numeral 601 denotes a reference potential generation circuit for generating a reference potential Vref to supply the sense amplifier blocks 604 with the reference potential Vref.

Hereinafter, a description will be made of a block structure for operating the sense amplifier block 604. In FIG. 6, the write/read circuit 602 receives externally-input read control signal RD, write control signal WT, and input data DI, while receiving an output signal IDO input from the sense amplifier block 604. The write/read circuit 602 outputs output data DO, while outputting and supplying set signals (ST, /ST) and reset signals (RST, /RST) to the sense amplifier block 604 according to the received write control signal WT and input data DI. The signals ST and RST of those set and reset signals, and the read control signal RD are supplied to the reference potential generation circuit 601, and the reference potential generation circuit 601 generates the reference potential Vref based on these input signals and supplies the sense amplifier block 604 with the reference potential Vref.

Figure 7:
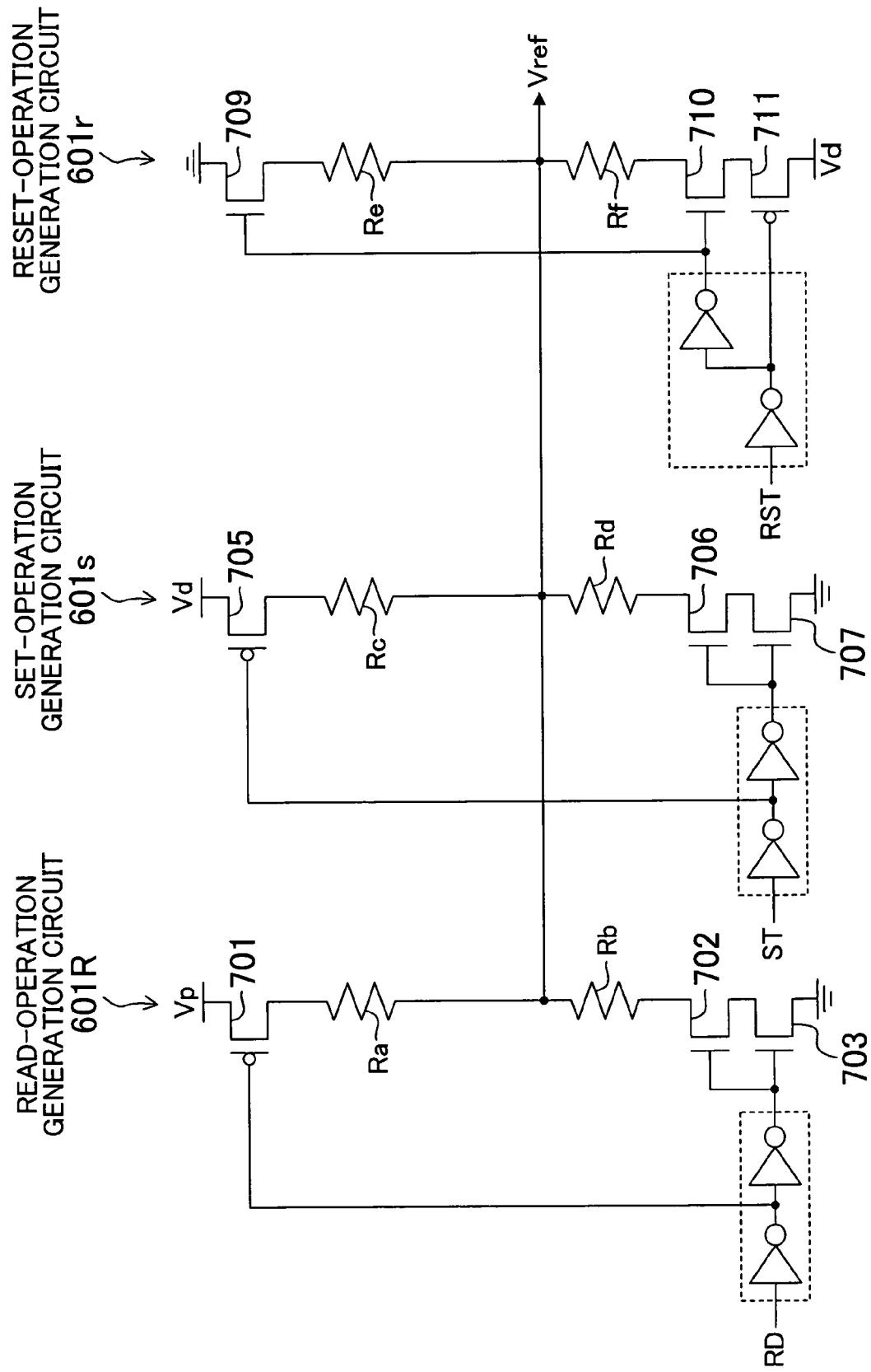
FIG. 7 shows the structure of a reference potential generation circuit included in the semiconductor integrated circuit according to the third embodiment of the present invention.

With reference to FIG. 7, the reference potential generation circuit 601 will be described. The reference potential generation circuit 601 includes a set generation circuit (a set-operation reference potential generation circuit) 601s, a reset generation circuit (a reset-operation reference potential generation circuit) 601r, and a read generation circuit (a data-read-operation reference potential generation circuit) 601R, as structures for generating different reference potentials Vref at the time of set operation, reset operation, and read operation. The structures of these generation circuits 601s to 601R are substantially the same as the respective structures for forming a path for current flowing in the resistance change memory device 403 at the time of data-write set operation, data-write reset operation, and data-read operation. Specifically, in the set generation circuit 601s, a Pch transistor 705 is equivalent to the Pch transistor in the bit-line write bias generation circuit 401 shown in FIG. 4, an Nch transistor 706 is equivalent to the selection transistor Ts in the resistance change memory device 403, an Nch transistor 707 is equivalent to the Nch transistor in the source-line write bias generation circuit 407, and the set signal (set command) ST is used as a selection signal. Likewise, in the reset generation circuit 601r, a Pch transistor 711 is equivalent to the Pch transistor in the source-line write bias generation circuit 407 shown in FIG. 4, an Nch transistor 710 is equivalent to the selection transistor Ts in the resistance change memory device 403, an Nch transistor 709 is equivalent to the Nch transistor in the bit-line write bias generation circuit 401, and the reset signal (reset command) RST is used as a selection signal. In the read generation circuit 601R, a Pch transistor 701 is equivalent to the Pch transistor in the bit-line precharge circuit 402 shown in FIG. 4, an Nch transistor 702 is equivalent to the selection transistor Ts in the resistance change memory device 403, an Nch transistor 703 is equivalent to the Nch transistor in the read bias generation circuit 405, and the read control signal (read command) RD is used as a selection signal.

By these structures, it is possible to generate the respective reference potentials Vref for set operation, reset operation and read operation by resistance division by the respective pairs of resistance devices (Rc, Rd), (Re, Rf), and (Ra, Rb), with the influence of the transistors located in the current paths being eliminated.

Figure 8:
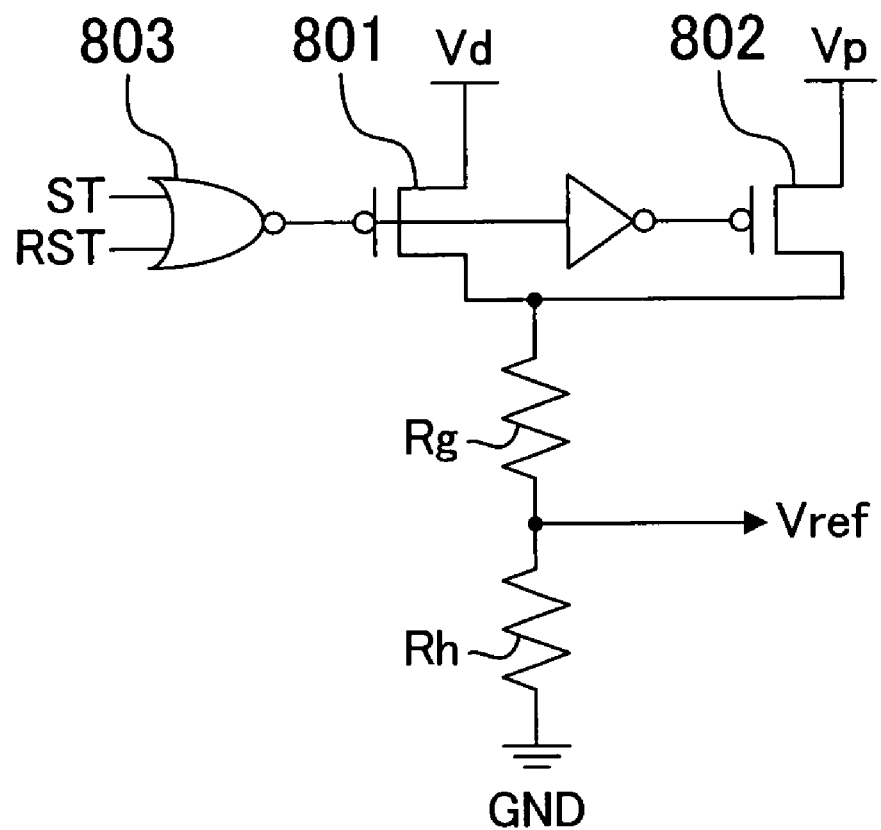
FIG. 8 shows a modified example of the reference potential generation circuit.

In a case in which the potential of the bit line BL corresponding to the resistance value of the resistance change memory device 403 is uniquely fixed at the reference potential for read operation, and data is written and read by using relative variations between the potential of the bit line BL and the data read voltage and between the potential of the bit line BL and the data write voltage, a reference potential generation circuit 601' shown in FIG. 8 may be used.

In the reference potential generation circuit 601' shown in FIG. 8, when either the control signal ST or RST is input, a first P-channel transistor 801 performs the ON operation through an NOR circuit (a selection circuit) 803 and supplies a set voltage Vd of a voltage source, which is connected with the source of the first P-channel transistor 801 and is used for data writing, to two series-connected resistances Rg and Rh provided for voltage division. And the reference potential generation circuit 601' outputs, as the reference potential Vref, the potential obtained by the resistance division. On the other hand, when neither a set operation nor a reset operation is performed, that is, when a read operation is performed, the reference potential generation circuit 601' makes another P-channel transistor 802 perform the ON operation, whereby, based on a precharge potential Vp, the reference potential Vref for the read operation is generated by resistance division by the two resistances Rg and Rh.

The above-described reference potential generation circuit 601 or 601' may be provided for each of the bit lines BL selected in accordance with each data input. Alternatively, the single reference potential generation circuit 601 or 601' may be shared. In that case, a selection signal may be used to make transfer gates perform selection operation so as to select a certain one of the bit lines BL.

Figure 9:
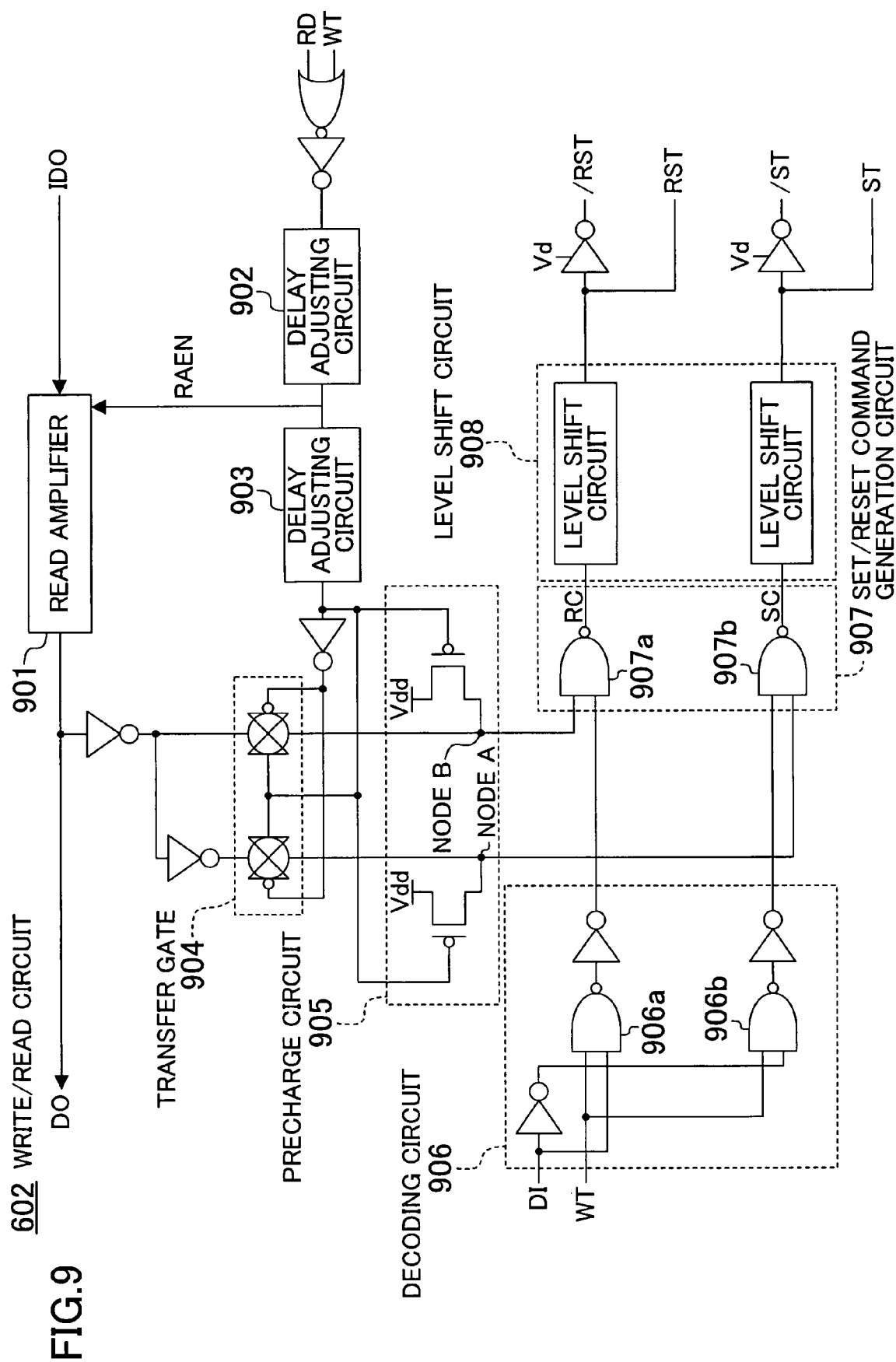
FIG. 9 shows the internal structure of a write/read circuit in the semiconductor integrated circuit according to the third embodiment of the present invention.
Figure 13:
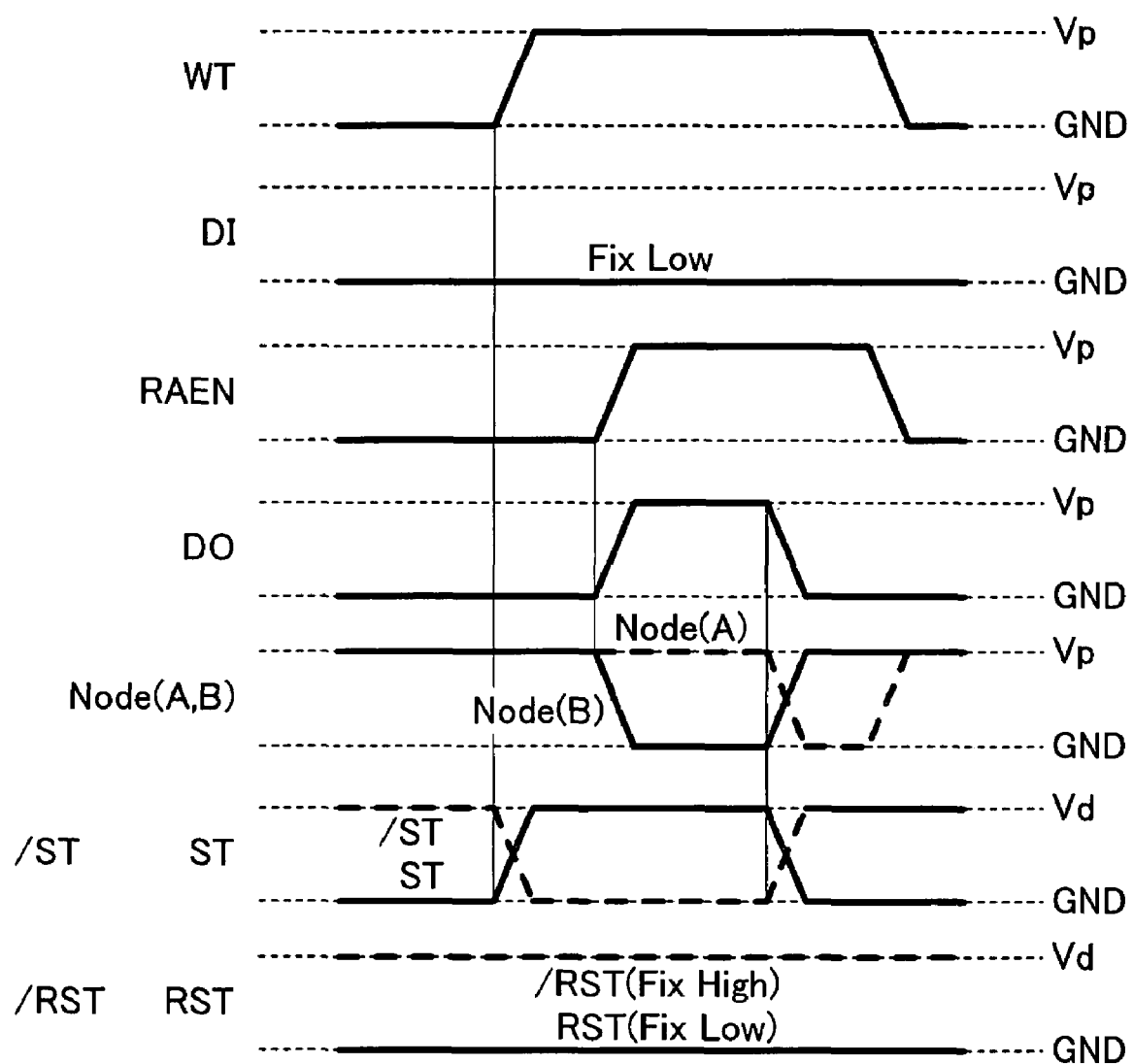
FIG. 13 shows various waveforms occurring when a set command is issued in the semiconductor integrated circuit according to the third embodiment of the present invention.
Figure 14:
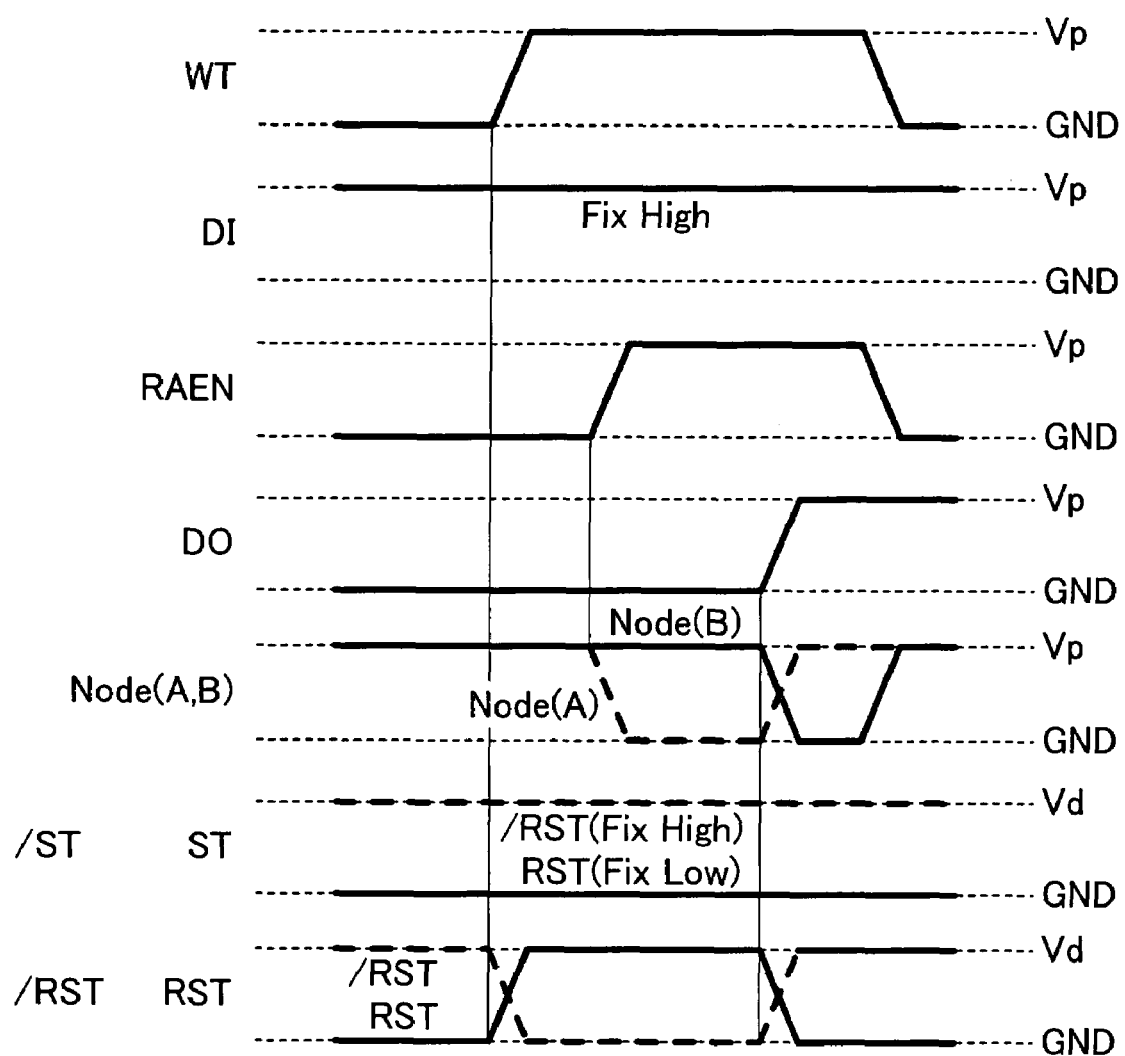
FIG. 14 shows various waveforms occurring when a reset command is issued in the semiconductor integrated circuit according to the third embodiment of the present invention.

Next, FIG. 9 illustrates an example of the internal structure of the write/read circuit (the write circuit) 602, and FIGS. 13 and 14 show signal waveforms occurring when the write/read circuit 602 operates. To be brief, the write/read circuit 602 is structured so that, during a data write operation, the write/read circuit 602 stops the data write operation in accordance with variation in the output signal of the sense amplifier that is performing amplification operation. Specific description will be given below.

In the write/read circuit 602 shown in FIG. 9, the reference numeral 901 refers to a read amplifier (a read-data output circuit), which receives the output signal IDO from the sense amplifier block 604 shown in FIG. 6 and externally outputs the output signal DO. The output signal DO of the read amplifier 901 has a certain phase difference relation with respect to the output signal IDO from the sense amplifier block 604.

When data is written, the sense amplifier (see the reference numeral 404 in FIG. 4) in the sense amplifier block 604 shown in FIG. 6 receives a sense amplifier enable signal SAE from an amplification control circuit 606 in the same manner and at the same start timing as when data is read, whereby the sense amplifier is controlled so as to constantly perform amplification operation during the data writing.

The read amplifier 901 receives, as a read amplifier enable signal RAEN, the output signal of a delay adjusting circuit 902 for delaying the read command RD or the write command WT by a set amount of time, and is thereby activated. The read amplifier 901 is therefore delayed by the set amount of delay time by the delay adjusting circuit 902 that is common to the write operation based on the write command WT and the read operation based on the read command RD, and thereafter the read amplifier 901 is started. Consequently, the timing when the read amplifier 901 is started at the time of the write operation is the same as the timing at which the read amplifier 901 is started at the time of the read operation.

The read amplifier enable signal RAEN from the delay adjusting circuit 902 is delayed by another delay adjusting circuit 903 by a certain amount of time. This delay time is equal to or longer than a period of time taken for the value of the output signal of the read amplifier 901 to be determined by the read amplifier enable signal RAEN. During this time period taken for the output of the delay adjusting circuit 903 to be determined, nodes A and B are precharged to the high level, i.e., to a set voltage VDD, by a precharge circuit 905. This state is a state in which the input of the write command WT is being awaited.

Also, in FIG. 9, a decoding circuit 906 includes two NAND circuits 906a and 906b, and decodes the set state and the reset state in accordance with the input data DI and the write command WT. A set/reset command generation circuit 907 includes two NAND circuits 907a and 907b and determines a set command SC or a reset command RC corresponding to the input data DI in accordance with a decode signal from the decoding circuit 906 and the high (Vdd) precharge states of the nodes A and B. The potential of the set command SC or reset command RC is reversed, and at the same time the set command SC or the reset command RC is level-shifted, by a level shift circuit 908. Thereafter, based on the commands SC and RC, the above-described two types of complementary signals (ST, /ST) and (RST, /RST) are generated. When the resistance value of the resistance change memory device 403 shown in FIG. 4 is changed by these two types of complementary signals in the above-described manner, the output value of the sense amplifier 404 varies. When, after the activation of the read amplifier enable signal RAEN, the output signal DO of the read amplifier 901 having received the output signal IDO of the sense amplifier 404 is determined, a transfer gate 904 transmits the output signal DO of the read amplifier 901 to the set/reset command generation circuit 907 to stop the set command SC or the reset command RC generated in the set/reset command generation circuit 907.

Hereinafter, with reference to the signal waveform in FIG. 13, a process from the generation of the set command SC to the automatic stop of the set command SC will be described specifically. When the write command WT transitions to the high level and the input data DI is at the low level, in the decoding circuit 906, the NAND circuit 906b which is related to the complementary signals ST and /ST operates to output decoding result that it is to be a high-level set command. Since the node A has been precharged to the high (Vdd) level, in the set/reset command generation circuit 907, the NAND circuit 907b related to the complementary signals ST and /ST operates to generate the high-level set command SC, whereby the signal ST transitions to the high output, while the signal /ST transitions to the low output. This state is maintained until the read amplifier enable signal RAEN is activated. Thereafter, the read amplifier enable signal RAEN becomes active. At this time, the output signal DO of the read amplifier 901 is initially at the high level, if the initial state of the data-write-target resistance change memory device 403 has been the reset state. But when the data-write-target resistance change memory device 403 changes into the set state, the output signal DO of the read amplifier 901 goes to the low level. This low-level output signal DO is transmitted to the node A via the transfer gate 904, such that the potential of the node A goes to the low level. Consequently, in the set/reset command generation circuit 907, the output of the NAND circuit 907b related to the complementary signals ST and /ST changes from the high level to the low level to stop the output of the set command SC. In a case in which the initial state of the data-write-target resistance change memory device 403 has been the set state, the output of the read amplifier 901 goes to the low level immediately when the read amplifier 901 is activated. Thus, the node A goes to the low level, whereby the set command SC in the set/reset command generation circuit 907 automatically stops immediately.

Next, with reference to the signal waveform shown in FIG. 14, a process from the generation of the reset command RC to the automatic stop of the reset command RC will be described specifically. When the write command WT transitions to the high level and the input data DI is at the high level, in the decoding circuit 906, the NAND circuit 906a which is related to the complementary signals RST and /RST operates to output decoding result that it is to be a high-level reset command. Since the node B has been precharged to the high (Vdd) level, in the set/reset command generation circuit 907, the NAND circuit 907a related to the complementary signals RST and /RST operates to generate the high-level reset command RC, whereby the signal RST transitions to the high output, while the signal /RST transitions to the low output. This state is maintained until the read amplifier enable signal RAEN is activated. Thereafter, the read amplifier enable signal RAEN becomes active. At this time, the output signal DO of the read amplifier 901 is initially at the low level, if the initial state of the data-write-target resistance change memory device 403 has been the set state. But when the data-write-target resistance change memory device 403 changes into the reset state, the output signal DO of the read amplifier 901 goes to the high level. This high-level output signal DO is transmitted to the node B via the transfer gate 904, such that the potential of the node B goes to the low level. Consequently, in the set/reset command generation circuit 907, the high output of the NAND circuit 907a related to the complementary signals RST and /RST changes to the low output to stop the output of the reset command RC. In a case in which the initial state of the data-write-target resistance change memory device 403 has been the reset state, the output of the read amplifier 901 goes to the high level immediately when the read amplifier 901 is activated. Thus, the node B goes to the low level, whereby the reset command RC of the set/reset command generation circuit 907 automatically stops immediately.

On the other hand, when data is read, the write command WT goes to the low level, whereby, in the decoding circuit 906, the outputs of the two NAND circuits 906a and 906b go to the low level, and, in the set/reset command generation circuit 907, the outputs of the two NAND circuits 907a and 907b go to the low level. Therefore, the set command SC and the reset command RC are not output.

As described above, in this embodiment, the set command SC or the reset command RC is generated according to the input data DI and the write command WT, whereby the resistance change memory device 403 is controlled into the set or reset state. Also, only after variation in the output signal IDO of the sense amplifier 404, resulting from the transition of the resistance change memory device 403 to the set or reset state, is awaited, with the reference potential Vref for the sense amplifier 404 in the sense amplifier block 604 being set variably in accordance with the input data DI and the write command WT, the set command SC or the reset command RC is made to stop automatically according to the output signal IDO. Thus, while the semiconductor memory device capable of precisely adjusting the resistance of the resistance change memory device 403 is configured, the configuration of the semiconductor memory device is simplified, because the typical data-read sense amplifier 404 and read amplifier 901 are used, without separately preparing special circuits, to make the set command SC or the reset command RC stop automatically. This allows further reduction in costs.

Figure 3:
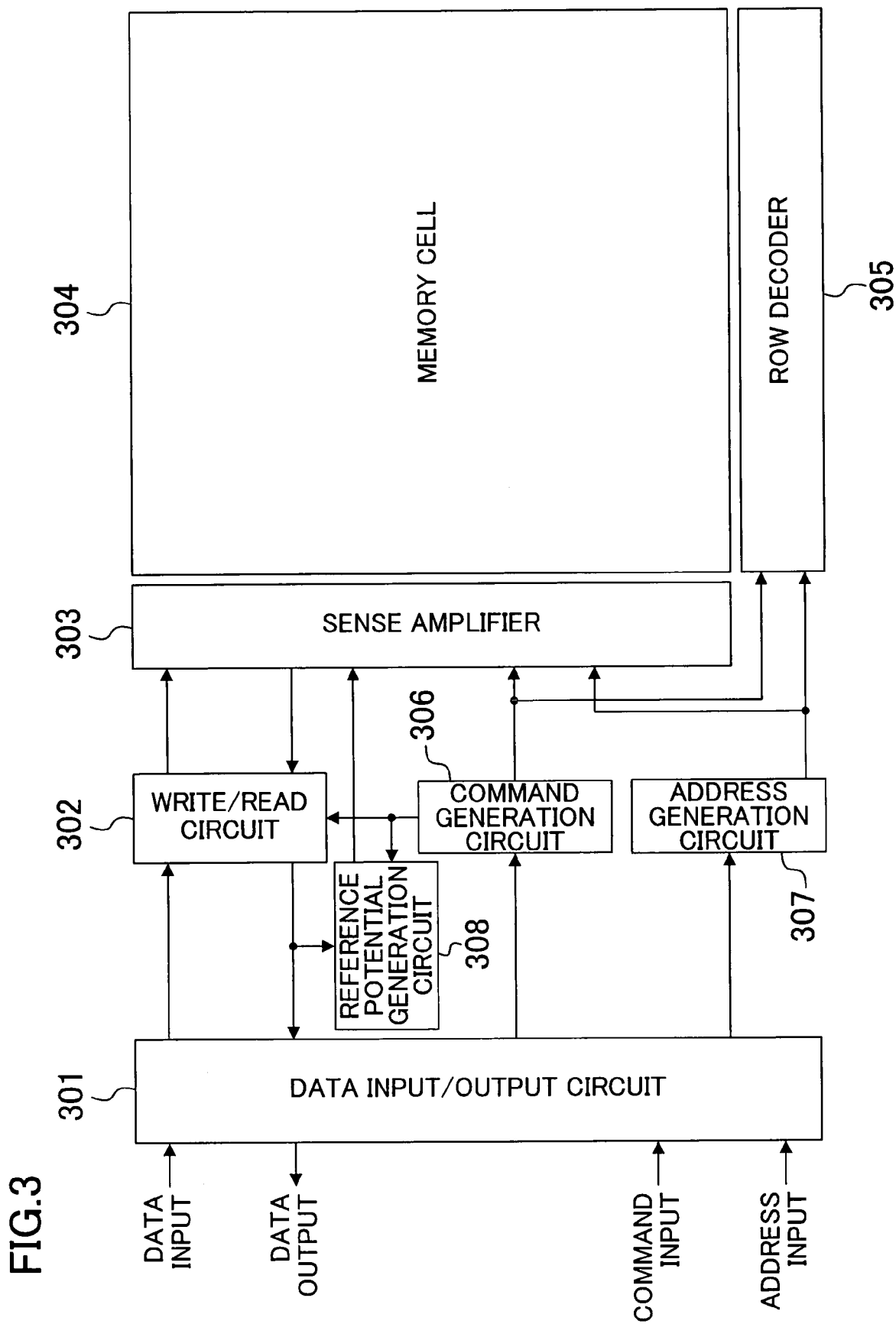
FIG. 3 shows the entire block structure of a semiconductor memory device according to the present invention.

Next, FIG. 3 is a block diagram illustrating a configuration in which the above-described set of circuits are configured as a core.

In FIG. 3, a data input/output circuit 301, which performs data input/output, command input, and address signal input, transmits the address signal to an address generation circuit 307. The address generation circuit 307 then transmits the address signal to a row decoder circuit 305 to generate a selection signal for selecting a word line WL. The command input into the data input/output circuit 301 is transmitted to a command generation circuit 306. The command generation circuit 306 transmits the received command to the row decoder 305, to a sense amplifier 303, to a reference potential generation circuit 308, and to a write/read circuit 302. The data input into the data input/output circuit 301 is transmitted to the write/read circuit 302 and then amplified by the sense amplifier 303. The amplified data is written into a memory cell array 304 including numerous resistance change memory devices 403.

In this embodiment, the sense amplifier 404 for data reading is also used as the sense amplifier for constantly performing amplification operation at the time of data writing. However, a sense amplifier for data writing may be provided separately.

Furthermore, the resistance change memory devices 403 adopted in the first to third embodiments have the structure including the series circuit that is composed of the memory device body M connected to the bit line (the column selection line) BL and the selection transistor Ts whose gate is connected to the word line (the row selection line) WL. However, the present invention is not limited to this structure, but resistance change memory devices having a different structure, in which a memory device body M is connected, directly or via a diode, between a column selection line and a row selection line, may be employed.

What is claimed is:

1. A semiconductor memory device, comprising:
   a resistance change memory device with a first node and a second node, for performing a set operation for data and a reset operation for the data by application of a forward bias voltage and a reverse bias voltage across the first and second nodes;
   a first selection line connected with the first node of the resistance change memory device;
   a second selection line connected with the second node of the resistance change memory device;
   a precharge circuit for precharging the first and second nodes of the resistance change memory device to a reference potential when the resistance change memory device is in standby mode;
   a bias applying circuit for applying a set high potential to one of the first and second nodes of the resistance change memory device and a set low potential to the other of the first and second nodes when the set operation for writing the data is performed, and applying the set low potential to the one node of the resistance change memory device and the set high potential to the other node when the reset operation for the written data is performed; and
   a read circuit for applying the reference potential to the first or second node of the resistance change memory device when a read operation for reading the data is preformed.

2. The semiconductor memory device of claim 1, wherein the read circuit applies, to the second or first node of the resistance change memory device, the set low potential or a potential which is higher than the reference potential by a potential required for the data read operation.

3. The semiconductor memory device of claim 1, wherein the reference potential is lower than the set high potential.

4. A semiconductor integrated circuit system including the semiconductor memory device of claim 1, the semiconductor integrated circuit system comprising:
   a system low-voltage source for supplying voltage to internal circuits, and a data input/output high-voltage source used for data input/output,
   wherein the reference potential used in the semiconductor memory device is power supply potential of the system low-voltage source,
   the set high potential used in the semiconductor memory device is power supply potential of the data input/output high-voltage source, and
   the set low potential used in the semiconductor memory device is ground potential.

5. The semiconductor memory device of claim 1, comprising:
   a memory cell array including a number of said resistance change memory devices,
   wherein the bias applying circuit is divided into a first bias applying circuit for applying a bias voltage to the first node of each resistance change memory device and a second bias applying circuit for applying a bias voltage to the second node of each resistance change memory device, and
   the first bias applying circuit is disposed at one side of the memory cell array, while the second bias applying circuit is disposed at the other side of the memory cell array.

6. The semiconductor memory device of claim 5, wherein the first and second bias applying circuits are controlled by a common bias-voltage-application control signal.

7. A semiconductor memory device, comprising:
   a resistance change memory device with a first node and a second node, for performing a set operation for data and a reset operation for the data by application of a forward bias voltage and a reverse bias voltage across the first and second nodes;
   a first selection line connected with the first node of the resistance change memory device;
   a second selection line connected with the second node of the resistance change memory device;
   a sense amplifier for amplifying a potential difference between a set reference potential and a potential produced by the value of resistance of the resistance change memory device;
   an amplification control circuit for making the sense amplifier constantly perform amplification operation when the data is written; and
   a write circuit for, at the time of the set operation for writing the data or the reset operation for the written data, starting the data set operation or the data reset operation in the resistance change memory device, and receiving an output signal from the sense amplifier to stop the data set operation or the data reset operation according to the received output signal.

8. The semiconductor memory device of claim 7, wherein a data-read sense amplifier, which is used when a read operation for reading the data is performed, is also used as the sense amplifier, and
   the semiconductor memory device further includes a set-operation reference potential generation circuit, a reset-operation reference potential generation circuit, and a data-read-operation reference potential generation circuit, which generate different reference potentials for the set operation for writing the data, the reset operation for the written data, and the data-read operation, each of the generated reference potentials being used as the set reference potential.

9. The semiconductor memory device of claim 8, wherein the write circuit stops the data set operation or the data reset operation according to an output signal from the data-read sense amplifier.

10. The semiconductor memory device of claim 8, comprising a read-data output circuit for externally outputting an output signal from the data-read sense amplifier,
    wherein the write circuit receives the output signal from the data-read sense amplifier through the read-data output circuit, and
    timing at which the data-read sense amplifier and the read-data output circuit are started at the time of the set operation for writing the data and the reset operation for the written data is the same as timing at which the data-read sense amplifier and the read-data output circuit are started at the time of the data read operation.

11. The semiconductor memory device of claim 8, wherein the three reference potential generation circuits, i.e., the data-write set-operation reference potential generation circuit, the written-data reset-operation reference potential generation circuit, and the data-read-operation reference potential generation circuit, each have a current path, which is the same as a path of current flowing in the resistance change memory device where the data is written or read at the time of the set operation for writing the data, the reset operation for the written data, and the data read operation, have a plurality of resistance devices for voltage division in the current path, and are selected according to a set command, a reset command, and a read command, respectively.

12. The semiconductor memory device of claim 7, comprising a reference potential generation circuit for generating the set reference potential, wherein the reference potential generation circuit includes:
a first P-channel transistor whose source is connected with a power source used for data writing;
a second P-channel transistor whose source is connected with a power source used for data reading;
a plurality of resistance devices for voltage division, all of which are connected with the first and second P-channel transistors; and
a selection circuit for selecting either the first or second P-channel transistor.

* * * * *